United States Patent
Bangert

(10) Patent No.: US 7,400,166 B2
(45) Date of Patent: Jul. 15, 2008

(54) DIGITAL LOGIC UNIT RECONFIGURABLE IN NONVOLATILE FASHION

(75) Inventor: Joachim Bangert, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/795,316

(22) PCT Filed: Dec. 21, 2005

(86) PCT No.: PCT/EP2005/057054

§ 371 (c)(1),
(2), (4) Date: Jul. 16, 2007

(87) PCT Pub. No.: WO2006/074859

PCT Pub. Date: Jul. 20, 2006

(65) Prior Publication Data

US 2007/0290717 A1    Dec. 20, 2007

(30) Foreign Application Priority Data

Jan. 14, 2005   (DE)   ........................ 10 2005 001 938

(51) Int. Cl.
*G06F 7/38* (2006.01)
*H03K 19/173* (2006.01)

(52) U.S. Cl. ............................. 326/37; 326/38; 326/47
(58) Field of Classification Search .................. None
See application file for complete search history.

(56) References Cited

U.S. PATENT DOCUMENTS

2003/0222375 A1* 12/2003 Dohmann et al. ...... 264/211.21
2003/0222676 A1* 12/2003 Lienau ..................... 326/41

FOREIGN PATENT DOCUMENTS

| DE | 100 53 206 C1 | 1/2002 |
| DE | 101 44 395 C1 | 10/2002 |
| WO | 02/35704 A1 | 5/2002 |
| WO | 2004/051853 A2 | 6/2004 |

OTHER PUBLICATIONS

R. Richter et al., "Nonvolatile field programmable spin-logic for reconfigurable computing", Applied Physics Letters, vol. 80, No. 7, Feb. 18, 2002, pp. 1291-1293.

(Continued)

*Primary Examiner*—Anh Q Tran
(74) *Attorney, Agent, or Firm*—Staas & Halsey LLP

(57) ABSTRACT

A circuit analyzes the configured status of cells with a magnetic layer system, resistance of which may be altered by magnetic field pulses, forming a first line branch with data cells arranged in series and a second line branch with configurable cells arranged in series. The circuit includes a difference amplifier for determining a voltage signal giving the difference voltage of the line branches. Also included in the circuit is a voltage shifter for shifting the voltage signal to a value other than 0 volts, such as an adder or subtractor. In addition, the circuit includes a comparator or window comparator, for the decision as to whether the voltage signal lies in a valid or forbidden range and an evaluation unit for evaluating a valid voltage signal and for output of a logical low or high signal.

12 Claims, 6 Drawing Sheets

OTHER PUBLICATIONS

M. Hassoun et al., "Field Programmable Logic Gates Using GMR Devices", IEEE Transactions on Magnetics, vol. 33, No. 5, Sep. 1997, pp. 3307-3309.

W. Black, Jr. et al., "Programmable logic using giant-magnetoresistance and spin-dependent tunneling devices", Journal of Applied Physics, vol. 87, No. 9, May 1, 2000, pp. 6674-6679.

International Search Report, mailed May 8, 2005 and issued in corresponding International Patent Application No. PCT/EP2005/057054.

German Patent Office Action, mailed Sep. 23, 2005 and issued in corresponding German Patent Application No. 10 2005 001 938.2-42.

* cited by examiner

DIGITAL LOGIC UNIT RECONFIGURABLE IN NONVOLATILE FASHION

CROSS REFERENCE TO RELATED APPLICATIONS

This application is based on and hereby claims priority to German Application No. 10 2005 001 938.2 filed on Jan. 14, 2005, the contents of which are hereby incorporated by reference.

BACKGROUND

Described below is a digital logic unit which can be reconfigured in nonvolatile form having cells which have a magnetic layer system and whose resistance can be altered by magnetic field pulses. Included in the digital logic unit are a first line path containing series-connected data cells and a second line path containing series-connected configurable configuration cells and a logic unit for evaluation of the configured states.

These cells allow information to be stored on a magnetic basis. The magnetization of a layer of the cell's magnetic layer system can be changed by a magnetic field pulse, which changes the magnetoresistance of this layer by a few percent. The respective resistance can be read and is a measure of the logic state of the cells.

It has already been proposed to implement programmable logic functions with cells which make use of the GMR effect. Such logic circuits may be of similar design to known programmable logic arrays and use magnetoresistive cells as nonvolatile programmable elements or as arrays of logic gates, the logic functions being able to be programmed by magnetic logic. These logic circuits have the advantage that both the program information and the data are nonvolatile. It is therefore possible to reprogram an entire logic array to a particular configuration as required.

The article "Programmable logic using giant-magnetoresistance and spin-dependent tunneling devices" (Black and Das, Journal of Applied Physics, Vol. 87, No. 9, Jan. 5, 2000) proposes magnetic comparator logic with a first line path containing series-connected data cells and a second parallel data path containing series-connected configuration cells. The possible states are evaluated by comparing configured magnetic cell contents with data cells. Both paths, that is to say the data cells and the configuration cells, carry a prescribed constant current, and the voltage drops produced by the respective cells are supplied to the inputs of a comparator. The magnetic configuration of the individual cells, which have either a high or a low resistance, produces a stepped signal profile. At the lowest voltage value, all the resistors have a low value, and if one has a high value and all the others have a low value then the next level is produced. To be able to evaluate the configured states, a comparator is required which ascertains the difference voltage for the two parallel paths. The comparator is able to check whether a particular condition is met; by way of example, the condition may be: "resistance of the path for the data cells is less than or equal to the resistance of the path for the configuration cells". Stipulating the switching thresholds is difficult, however, since a series of parameters influences the properties of the magnetic cells. By way of example, these include the inequality of current sources in the two paths, fluctuations caused by lithography, discrepancies in the supply resistors, any asymmetric response which the comparator may have, and other effects.

SUMMARY

An aspect is to solve the problem of providing a digital logic unit which can be reconfigured in nonvolatile fashion and which can perform an evaluation for the configured states which allows a safe decision.

A differential amplifier for ascertaining a voltage signal indicating the difference voltage for the line paths provides evaluation means. Each of the magnetic cells produces a voltage drop, the outputs of the two line paths are supplied to the inputs of the differential amplifier, which forms the difference voltage for the two input voltages and amplifies this voltage signal if appropriate. In addition, preferably an adder or subtractor is used to shift the voltage signal ascertained by the differential amplifier to a value which is different than 0 volt. A signal shifted in this manner can subsequently be evaluated particularly easily by a comparator or window comparator which decides whether the voltage signal is in a valid range or in a prohibited range. This circuit group is advantageously a subtractor or an adder. In addition, the logic unit includes means for rating a valid voltage signal and for outputting a logic Low or High signal.

The comparator "filters out" those voltage signals which are in the prohibited range; in this context, provision may also be made for an error signal to be output when the voltage signal is in the prohibited range. The valid voltage signals are then supplied to a rating means which outputs either a logic Low signal or a High signal. This allows the configured states to be reliably distinguished.

Preferably, the means for rating a valid voltage signal may include a comparator, which may possibly be the aforementioned comparator or a window comparator which decides whether the voltage signal is in a valid or a "prohibited" range.

One particularly simple design is obtained when the means for rating a valid voltage signal performs one of the following logic operations: "less than", "less than or equal to", "greater than" or "greater than or equal to".

It is also possible for subtractor or adder to shift the voltage signal such that the value 0 volt is essentially in the center between the voltage levels which are to be rated. With such a shift in the voltage, all higher voltages deliver logic "High" and all voltages below it deliver logic "Low". Accordingly, the shift occurs in the negative direction.

In line with one particularly preferred development, the logic unit may include a circuit for producing a reference voltage which indicates the signal swing for a magnetic cell, multiplied by a current which is characteristic of the circuit.

This reference voltage can be used to derive a second reference voltage, indicating the voltage difference between two levels, by virtue of multiplication by the gain factor of the differential amplifier, halving and division by the number of configuration cells in the line path. These operations can be implemented by active or passive circuits.

To simplify the evaluation further, provision may be made for the second reference voltage to be able to be divided into three voltage ranges which are preferably of equal magnitude, where the middle voltage range corresponds to the prohibited range and the two other voltage ranges correspond to the logic Low or High signal. There is therefore a central, prohibited range which is surrounded by valid ranges at the "top" and "bottom", the range boundaries being obtained by dividing the second reference voltage into the three ranges. These boundaries for the voltages can be obtained with comparatively little circuit complexity.

Further logic functions can be implemented when the logic unit can produce a logic signal if the difference voltage is within the prohibited zone. Instead of outputting an error signal in this case, it is alternatively possible for a logic signal to be produced. This logic signal can be passed to an output which is at logic High when the difference voltage is 0. Depending on the configured cells, the following logic functions can be produced in this manner: NOR, XOR, AND. It is also possible to connect an inverter downstream in order to implement one of the following logic functions: XNOR, NAND, OR.

BRIEF DESCRIPTION OF THE DRAWINGS

These and other objects and advantages will become more apparent and more readily appreciated from the following description of exemplary embodiments, taken in conjunction with the accompanying drawings of which.

DETAILED DESCRIPTION OF THE PREFERRED EMBODIMENT

Figure 1:
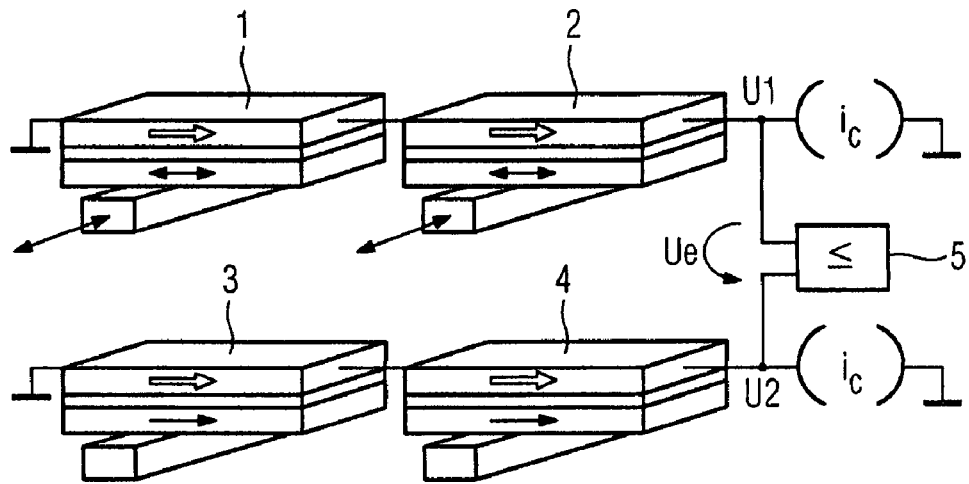
FIG. 1 is a three-dimensional block diagram of a known logic unit having two data cells and two configuration cells.

Reference will now be made in detail to the preferred embodiments, examples of which are illustrated in the accompanying drawings, wherein like reference numerals refer to like elements throughout.

FIG. 1 shows a known logic unit having two data cells and two configuration cells. The data cells 1, 2 and the configuration cells 3, 4 have a respective magnetic layer system. A line running transversely with respect to the magnetic layers can exert a magnetic field pulse on the cells, which changes the resistance of the cells. This means that each of the cells has either a high or a low resistance according to the magnetic field pulse applied.

The data cells 1, 2 and the configuration cells 3, 4 are respectively connected in series and are connected to constant current sources, so that the paths carry a constant current level $i_c$. The paths formed by the data cells 1, 2 and the configuration cells 3, 4 deliver voltage signals U1 and U2 on the basis of the voltage drops across the two paths, which are routed to the inputs of a comparator 5.

Figure 2:
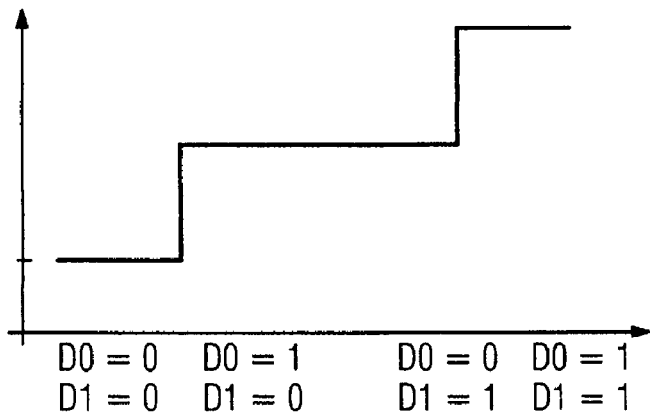
FIG. 2 is a graph of the resistance of the cells on the basis of the magnetic configuration.

FIG. 2 shows the resistance of the data cells on the basis of the magnetic configuration. The magnetic configuration of the individual cells 1, 2, which are denoted by D0 and D1 in FIG. 2 and which may have either a high resistance or a low resistance, produces a stepped profile for the total resistance of the path for the series-connected cells. If both cells have a low resistance, the resistance is at its lowest. If the first data cell D0 or the second data cell D1 has a high resistance and the other data cell has a low resistance, a moderate resistance value is obtained; if both data cells D0, D1 have a high resistance, the highest level of total resistance is obtained. FIG. 2 shows the response for a path containing two cells; if more than two cells are present in a path, the number of levels increases accordingly.

The comparator 5 shown in FIG. 1 is intended to be used to ascertain the difference voltage in the two paths. The relative change in the resistance of a cell during magnetic switching is referred to as the XMR signal swing. This gives the voltage difference XMR·U as a result of the magnetic switching. In this context, it is assumed that the data path and the configuration path contain the same number of cells. The voltage drops are meant to match in each case for the individual cells.

The height of the levels can be determined by: $\Delta U = XMR/p \cdot U$, where p is the number of cells connected in series. The voltage can also be expressed by $i_c \cdot R_{min}$, so that $\Delta U = XMR/p \cdot i_c \cdot R_{min}$.

The comparator decides whether the difference voltage U1−U2 for the two line paths reaches the lowest positive value or is 0, this also including the case of less than 0.

If the number of high-resistance cells is greater than the number of low-resistance cells, the difference voltage is positive and the logic function "less than or equal to" returns the result logic 1. If the number of high-resistance cells is the same as the number of low-resistance cells, the difference voltage is 0 and the output delivers logic 0. If the number of high-resistance cells is lower than the number of low-resistance cells, the difference voltage is negative and the output delivers logic 0.

To illustrate the magnetic states, a simplified notation is used:

/ a resistance is at a maximum

\ a resistance is at a minimum

Since the positions of the nominally identical resistances within each path are interchangeable (Λ corresponds to V), the resistances are always shown in a form sorted such that the cells with maximum resistance (/) are entered on the left-hand side.

The table below shows the states of the data cells and of the configuration cells, the respective difference voltage and the logic output signal.

| Data cells | Configuration cells | Difference voltage | Output | Function |
|---|---|---|---|---|
| \\ | \\ | zero | logic 0 | |
| Λ | \\ | positive | logic 1 | OR |
| // | \\ | positive | logic 1 | |
| \\ | Λ | negative | logic 0 | |
| Λ | Λ | zero | logic 0 | AND |
| // | Λ | positive | logic 1 | |
| \\ | // | negative | logic 0 | |
| Λ | // | negative | logic 0 | const |
| // | // | negative | logic 0 | |

This logic gate can be configured between the functions OR and AND. The logic function AND can be configured by selecting one of the configuration cells to be high resistance and selecting the other to be low resistance. The configuration with two high-resistance configuration cells produces a constant output. For the other configurations, at least one configuration cell is always in the low-resistance state.

So that a reliable decision can be made regarding whether the configured reference path or the data path has a higher resistance, a "prohibited" range or a "prohibited" zone is defined, with voltages above this zone being interpreted as logic 1 and voltages below this zone being interpreted as logic 0. If no prohibited zone were to be defined, certain parameter fluctuations would not allow a decision to be made between logic 0 and logic 1. Such fluctuations in the cell properties indicate faults; the parameter fluctuations can be caused, inter alia, by the inequality of constant current sources, lithography fluctuations, the paired nature of the XMR effect, supply line resistances or an asymmetric comparator circuit.

Figure 3:
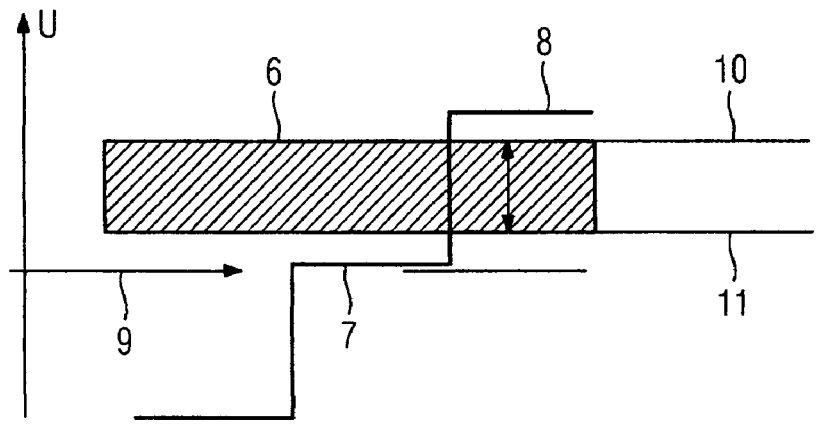
FIG. 3 is a graph of the voltage profile and of the prohibited range.

FIG. 3 shows a graph of the stepped difference voltages and also the prohibited range.

The horizontal axis shows three different configurations, and the vertical axis indicates the voltage. The prohibited zone 6 shown is between the selected levels 7, 8. For the logic function "less than or equal to", the next lowest level is 0 volt, which is indicated by the arrow 9. The next highest level has the value $1 \cdot XMR/m \cdot U$. In this case, m is the number of cells connected in series, that is to say at least 2. The prohibited zone 6 is bounded by the upper boundary 10 and the lower boundary 11.

The prohibited zone can be matched to manufacture-dependent wafer-specific parameter fluctuations in the magnetic or in the semiconductive part. Setting the height of the prohibited zone allows matching to the XMR effect and the local parameter fluctuations. Above and below the prohibited zone, it is possible to define safety zones which permit parameter fluctuations in a certain range. As references for the prohibited zone, at least two items of information are required, namely the height and the position. The prohibited zone should have the same temperature response as the magnetic part of the logic gate. The maximum height of the prohibited zone is obtained from the change in the resistance of an XMR cell.

It is possible to output a signal when the output voltage is in the prohibited zone. Such a signal may indicate an incorrect response from the logic unit, for example a fault.

Figure 4:
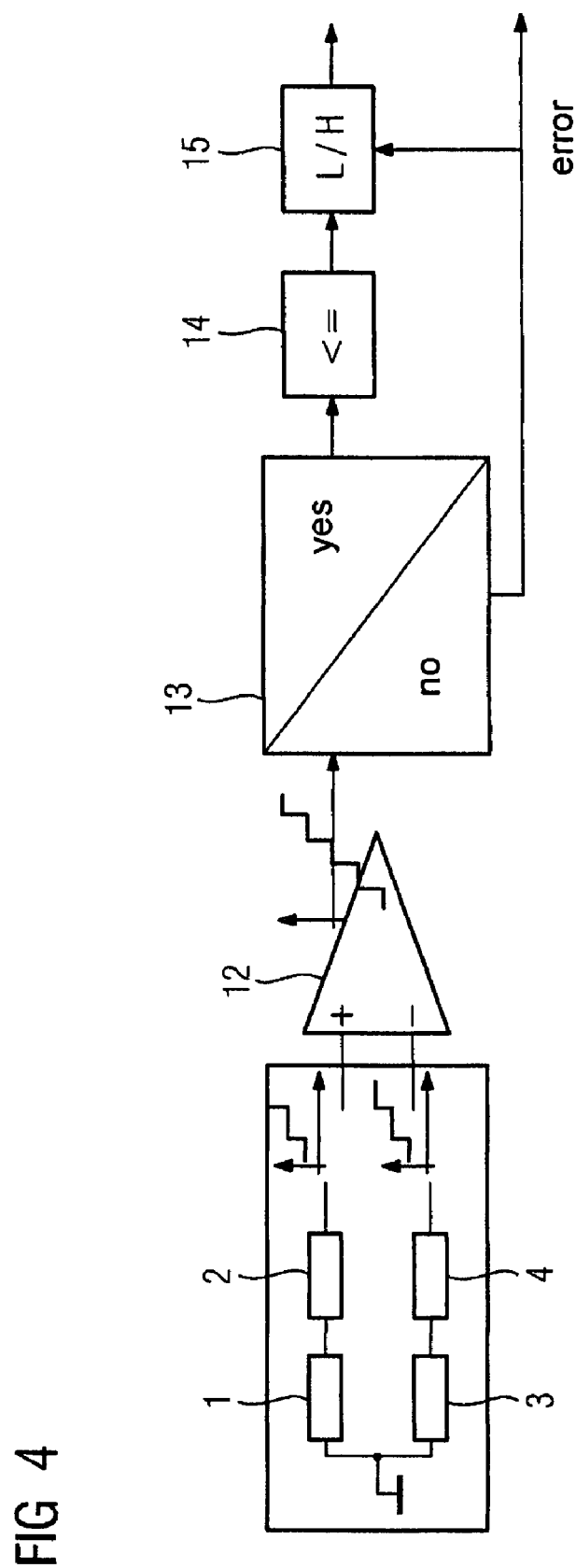
FIG. 4 is a block circuit diagram of a logic unit.

FIG. 4 shows a schematic diagram of the logic unit.

In the exemplary embodiment shown, data cells 1, 2 and configuration cells 3, 4 are used which are respectively connected in series. The magnetic cells output a voltage value which is converted in a differential amplifier 12 to form a difference voltage which takes 0 volt as a reference; that is to say that it is a potential. This difference voltage can be amplified or attenuated by the factor K. However, disturbances such as noise are also amplified with it, and therefore the differential amplifier 12 cannot be used to rate the voltage signal which is output.

Next, a check is performed in step 13 to determine whether the difference voltage delivered by the differential amplifier is valid or whether it is within the prohibited zone. Step 13 is necessary in order to prevent incorrect ratings, which may be caused by component defects or by manufacture-dependent parameter fluctuations, for example. To this end, the validity of the difference voltage is checked for an infringement of the prohibited zone, the decision criterion used being the logic function "less than or equal to". If the prohibited zone has not been infringed, there is no error and the output signal is valid. On the other hand, if the voltage level is within the prohibited zone, an error signal can be output. The valid signal is rated in a comparator 14 and is passed to the output 15 as "0" or "1". If it has been established in step 13 that the voltage level is invalid, an error signal is output.

Figure 5:
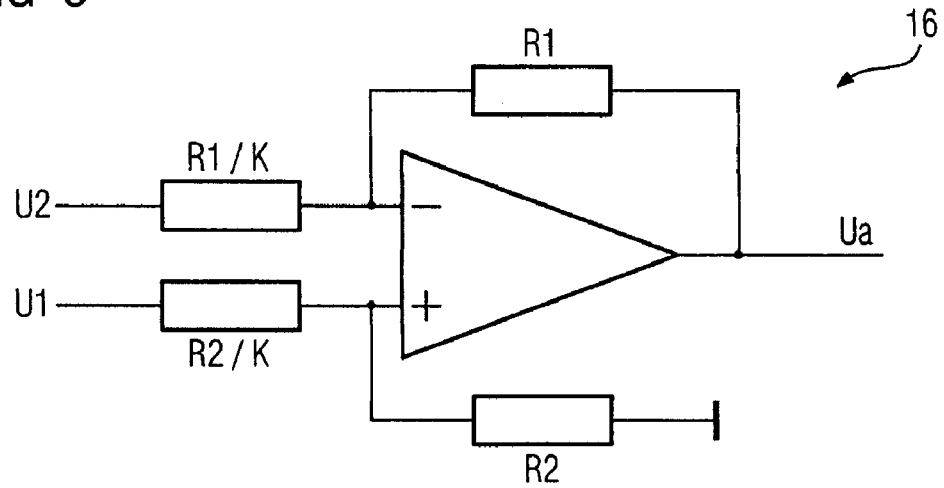
FIG. 5 is a block circuit diagram of a subtraction circuit in the logic unit.

FIG. 5 shows a subtraction circuit in the logic unit. The difference voltage is formed using a differential amplifier stage 16 with the gain K. The input voltages U1 and U2 are delivered by the two line paths for the data and configuration cells. The differential amplifier stage 16 outputs the output voltage $Ua = K \cdot (U1 - U2)$.

Next, the result is shifted in the voltage range such that no level is at 0 volt.

Figure 6:
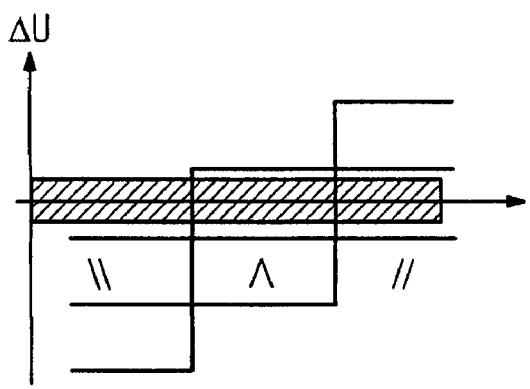
FIG. 6 is a graph of the difference voltages for different configurations.

FIG. 6 shows the difference voltages for the different configurations and also the prohibited zone. In this case, the 0-volt level is situated centrally between two levels, specifically between those levels at which the rating is intended to take place. Voltages above the prohibited zone deliver a logic High signal, and voltages below the prohibited zone deliver a logic Low signal. Accordingly, the shift has to take place in a negative direction, that is to say downward in the graph from FIG. 6, by the reference voltage $Uref1 = XMR/p \cdot U/2$.

In other embodiments, this level can also be combined with the differential amplifier stage 16 shown in FIG. 5.

Figure 7:
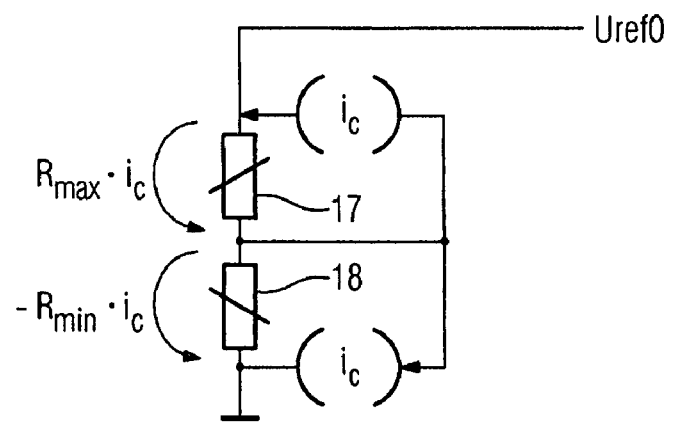
FIG. 7 is a block circuit diagram of a circuit for producing a reference voltage.

FIG. 7 shows a circuit for producing a reference voltage.

The circuit shown in FIG. 7 includes magnetic cells, namely a high-resistance cell 17 and a low-resistance cell 18, across which the voltages $R_{max} \cdot i_c$ and $-R_{min} \cdot i_c$ drop. This circuit delivers the TMR signal swing times the current $i_c$ which is characteristic of the circuit as an output voltage. This produces the reference voltage Uref0. To produce the reference voltage Uref1, it is necessary to multiply by K, to halve and to divide by p. p indicates the number of cells connected in series. The reference voltage Uref1 can be produced using active or passive circuits.

In this exemplary embodiment, the boundaries of the prohibited zone are stipulated by dividing a level into three parts. The central range of this level forms the prohibited zone, and the ranges which are below and above that are associated with the lower and upper levels as logic values. Dividing the levels into three ranges means that following the shift the references voltages $$Uref2 = +K \cdot XMR/p \cdot U/6$$

$$Uref3 = -K \cdot XMR/p \cdot U/6$$

need to be produced. These reference voltages can be obtained by the selected shift through inversion. The reference voltage used as base reference is obtained as shown in FIG. 7, and this reference voltage is attenuated or amplified on the basis of the following formula:

$$Uref0 = K/p \cdot Uref$$

Figure 8:
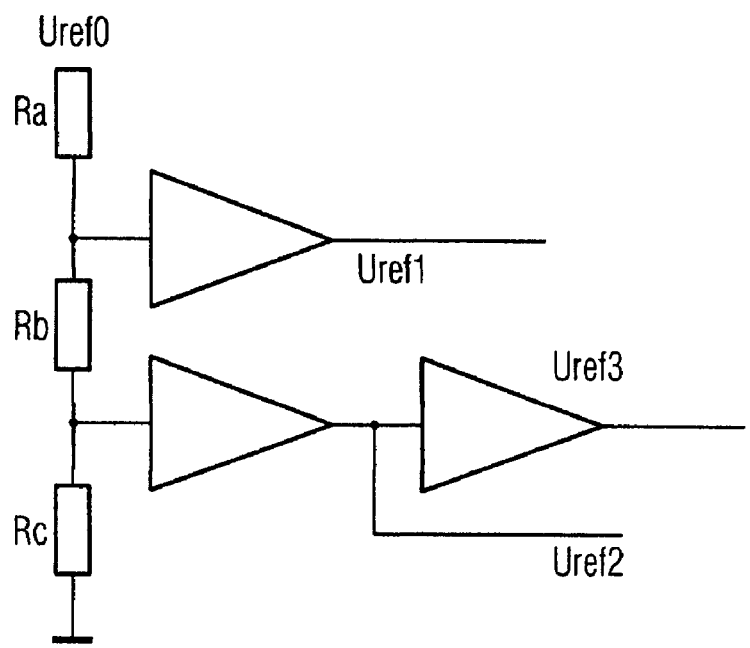
FIG. 8 is a block circuit diagram of a circuit for producing further reference voltages.

FIG. 8 shows a circuit for producing the requisite reference voltages. The ratio of the resistances is stipulated as follows:

$$Ra:Rb:Rc = 3:2:1$$

The reference voltage Uref2 is then inverted. The reference voltages produced in this manner can be used by a plurality of logic units in an integrated circuit.

Figure 9:
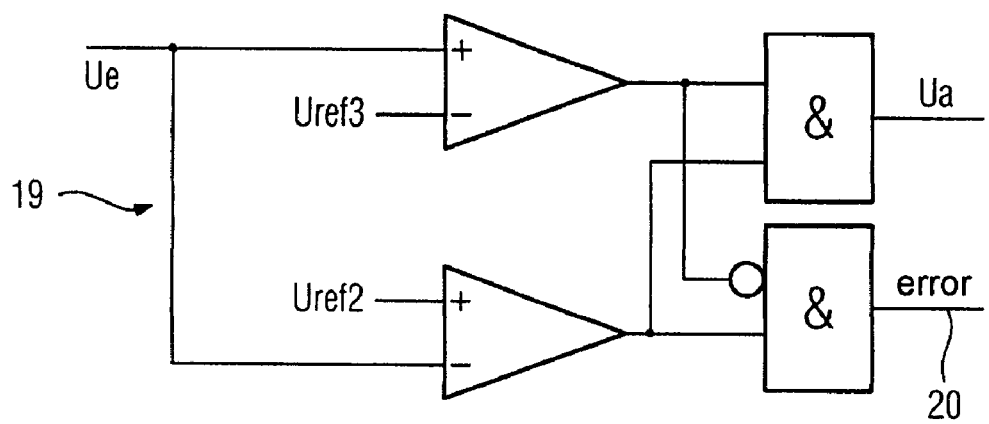
FIG. 9 is a block circuit diagram of a window comparator.

FIG. 9 shows a window comparator 19 which decides whether the prohibited zone has been infringed. If the voltage is within the prohibited range, an error signal is output via an output line 20. Otherwise, if the voltage is not within the prohibited zone, the voltage Ua is output.

Figure 10:
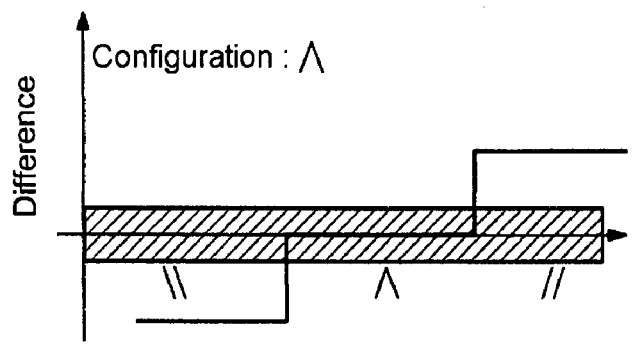
FIG. 10 is a graph of the difference voltages in order to evaluate values in the "prohibited" range.

FIG. 10 shows a graph of the difference voltages for a second exemplary embodiment, in which values which fall into the prohibited range are also evaluated. This additional information extends the scope of design for the magnetic logic considerably, and in particular it is possible to implement further logic functions. To avoid confusion, the "prohibited zone" is renamed as "central zone" in the second exemplary embodiment. The table below shows the states of the data and configuration cells, the difference voltage and also the outputs 1 and 2. The "Output 1" column corresponds to the output signals from the logic unit in the first exemplary embodiment. In a further step, the values from "Output 2" are formed as the logic function for the inputs.

| Data cells | Configuration cells | Difference voltage | Output 1 | Output 2 | Function |
|---|---|---|---|---|---|
| \\ | \\ | zero | logic 0 | logic 1 | |
| ∧ | \\ | positive | logic 1 | logic 0 | NOR |
| // | \\ | positive | logic 1 | logic 0 | |
| \\ | ∧ | negative | logic 0 | logic 0 | |
| ∧ | ∧ | zero | logic 0 | logic 1 | XOR |
| // | ∧ | positive | logic 1 | logic 0 | |
| \\ | // | negative | logic 0 | logic 0 | |
| ∧ | // | negative | logic 0 | logic 0 | AND |
| // | // | zero | logic 0 | logic 1 | |

"Output 1" corresponds to the logic functions OR, AND and const. "Output 2" changes to logic "1" if the difference voltage falls into the central zone. This results in the logic functions NOR, XOR and AND. A downstream inverter can be used to produce the functions XNOR, NAND and OR.

Figure 11:
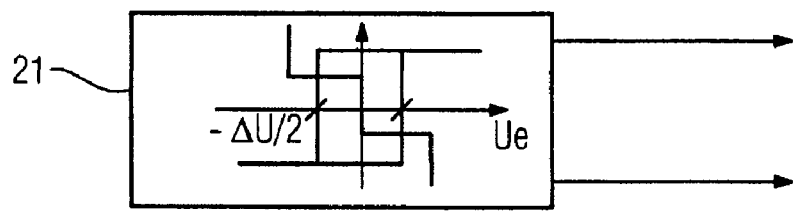
FIG. 11 is a schematic illustration of the switching thresholds of a window comparator.

FIG. 11 is a schematic illustration of the switching thresholds for a window comparator. The decision regarding whether the difference voltage is below, above or within the central zone is made using the window comparator 21. The central zone is situated centrally around the central level, which is close to the 0-volt line. The width of the central zone is set such that it corresponds approximately to a level height $\Delta U$.

The window comparator 21 switches when the input voltage exceeds the upper threshold value, which in this case is $\Delta U/2$. The window comparator 21 switches again when the input voltage drops below the lower threshold value, which in this case is $-\Delta U/2$.

To produce the threshold values which bound the central level, the voltages $\Delta U = \pm XMR/p \cdot U/2$ need to be produced, with the voltage symmetry with respect to 0 volt advantageously being used.

Figure 12:
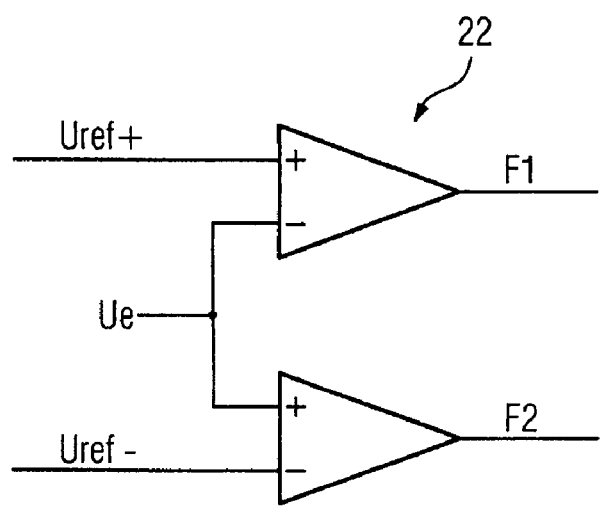
FIG. 12 is a block circuit diagram of a window comparator.

FIG. 12 shows a window comparator 22 to which two reference voltages Uref+ and Uref− are supplied. The voltage Ue obtained as shown in FIG. 11 is applied to the input of the window comparator 22, and the intermediate results F1 and F2 are output at the outputs of the window comparator 22. These signals can be processed further as logic signals either using magnetic logic or using silicon.

Figure 13:
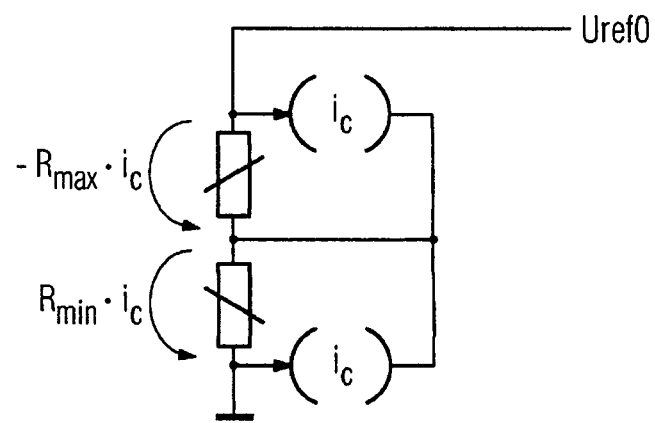
FIG. 13 is a block circuit diagram of a circuit for producing a reference voltage.

FIG. 13 shows a circuit for producing a reference voltage. The basic design corresponds to that of the circuit from FIG. 7. In a first step, the level height is produced as reference voltage $Uref1 = i_c \cdot XMR \cdot R_{min}$. To this end, the difference between the two voltage drops across the high-resistance cell and the low-resistance cell is accordingly related to 0. The use of an inverting amplifier results in: $Uref0 = -Uref1$. In a second step, this reference voltage is brought to half of the actually required level height $\Delta U$. This can be done either passively by a voltage divider or actively by an operational amplifier. In a third step, this voltage is also produced as an inverted voltage.

Figure 14:
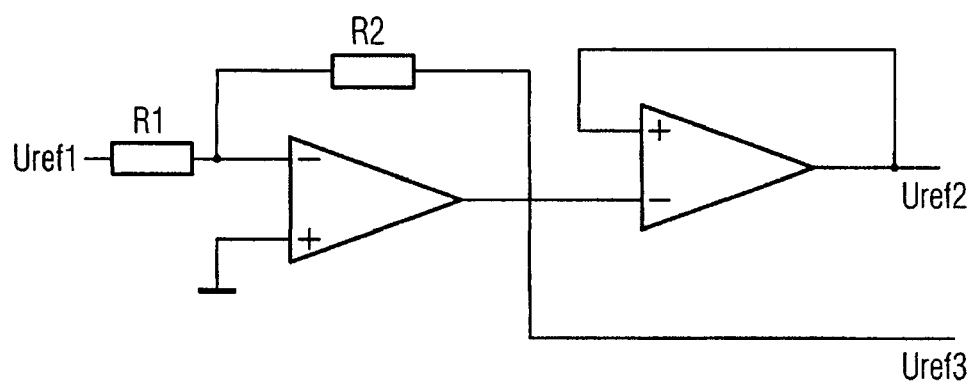
FIG. 14 is a block circuit diagram of a circuit for producing symmetric threshold values for the prohibited range.

FIG. 14 shows a circuit for producing symmetric threshold values for the prohibited range.

In this case, $Uref3 = -Uref1 \cdot R2/R1$ and $Uref2 = -Uref3$.

If there are four TMR cells in a path, for example, whose resistances are between approximately 0.1 ohm and 1 Mohm, the circuit shown in FIG. 14 may have the following resistances when the difference voltage is not amplified, that is to say K=1: R1=800 kohm, R2=R1/p/2=100 kohm.

If the levels are "expanded" by amplifying the difference voltage, a lower level of attenuation can be selected, and at a gain of K=4 the result is: R1=800 kohm, R2=R1/p/2·4=400 kohm. Uref2 is linked to Uref+, and Uref3 is linked to Uref−.

The behavior of the intermediate results F1 and F2 can be described as follows: F1 changes from a positive operating voltage to the negative operating voltage when $$Ue \cdot K > Uref2 = ic \cdot XMR \cdot Rmin/p/2 \cdot K.$$

F1 changes back again as soon as it is smaller. F2 changes from a negative operating voltage to the positive operating voltage when $$Ue \cdot K > Uref3 = -ic \cdot XMR \cdot Rmin/p/2 \cdot K.$$

F2 changes back as soon as it is smaller.

The value of the intermediate results F1 and F2 on the basis of the data and configuration cells are obtained from the following table:

| Data cells | Configuration cells | Difference voltage | F1 | F2 |
|---|---|---|---|---|
| \\ | \\ | zero | logic 1 | logic 1 |
| ∧ | \\ | positive | logic 0 | logic 1 |
| // | \\ | positive | logic 0 | logic 1 |
| \\ | ∧ | negative | logic 1 | logic 0 |
| ∧ | ∧ | zero | logic 1 | logic 1 |
| // | ∧ | positive | logic 0 | logic 1 |
| \\ | // | negative | logic 1 | logic 0 |
| ∧ | // | negative | logic 1 | logic 0 |
| // | // | zero | logic 1 | logic 1 |

For the inputs of the data cells, which in this case are denoted by D1 and D0, the following logic functions are obtained:

| Output | \\ | ∧ | // |
|---|---|---|---|
| F1 | NOR | NAND | const = 1 |
| F2 | const = 1 | OR | AND |

By inverting the outputs, the following functions are obtained for the inputs D1 and D0:

| Output | \\ | ∧ | // |
|---|---|---|---|
| NOT (F1) | OR | AND | const = 0 |
| NOT (F2) | const = 0 | NOR | NAND |

This can be used to form the following gate functions:

| Function | \\ | ∧ | // |
|---|---|---|---|
| OR (F1; F2) | const = 1 | const = 1 | const = 1 |
| NOR (F1; F2) | const = 0 | const = 0 | const = 0 |
| AND (F1; F2) | NOR | XOR | AND |
| NAND (F1; F2) | OR | XNOR | NAND |

If these gate functions are inverted, the following are obtained:

| Function | \\ | ∧ | // |
|---|---|---|---|
| OR (NOT(F1); NOT(F2)) | OR | XNOR | NAND |
| NOR(NOT(F1); NOT(F2)) | NOR | XOR | AND |
| AND(NOT(F1); NOT(F2)) | const = 0 | const = 0 | const = 0 |
| NAND(NOT(F1); NOT(F2)) | const = 1 | const = 1 | const = 1 |

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A digital logic unit which can be reconfigured in non-volatile form having cells which have a magnetic layer system and whose resistance can be altered by magnetic field pulses, comprising:
    a first line path containing series-connected data cells;
    a second line path containing series-connected configurable configuration cells; and
    evaluation means for configured states of said first and second line paths, said evaluation means including
        a differential amplifier ascertaining a voltage signal indicating a difference voltage between the line paths;
        one of an adder and a subtractor shifting the voltage signal to a value which is different than zero volt;
        one of a first comparator and a window comparator deciding whether the voltage signal is in a valid range or in a prohibited range; and
        means for rating a valid voltage signal and for outputting a logic Low or High signal.

2. The logic unit as claimed in claim 1, further comprising an output outputting an error signal when the voltage signal is within the prohibited range.

3. The logic unit as claimed in claim 1, wherein said means for rating a valid voltage signal comprises a second comparator.

4. The logic unit as claimed in claim 1, wherein the one of the first comparator and the window comparator also provides said means for rating the valid voltage signal.

5. The logic unit as claimed in claim 4, wherein said means for rating the valid voltage signal is based on one of a less than logic operation, a less than or equal to logic operation, a greater than logic operation and a greater than or equal to logic operation.

6. The logic unit as claimed in claim 5, wherein said one of an adder and a subtractor shifts the voltage signal such that zero volt is essentially centered between voltage levels which are to be rated.

7. The logic unit as claimed in claim 6, further comprising a circuit producing a first reference voltage which indicates a signal swing for a magnetic cell multiplied by a current which is a characteristic of said circuit.

8. The logic unit as claimed in claim 7, wherein the first reference voltage is used to derive a second reference voltage, indicating a voltage difference between two levels, by multiplying by a gain factor of the differential amplifier and dividing by two times a number of configuration cells in the second line path.

9. The logic unit as claimed in claim 8, wherein the second reference voltage is divided into upper, middle and lower voltage ranges of substantially equal magnitude, where the middle voltage range corresponds to the prohibited range and the upper and lower voltage ranges correspond to the logic Low and High signals, respectively.

10. The logic unit as claimed in claim 1, further comprising an output outputting a logic signal when the difference voltage is within the prohibited zone.

11. The logic unit as claimed in claim 10, wherein the setting of the configuration cells can be taken as a basis for selecting one of NOR, XOR, and AND logic functions.

12. The logic unit as claimed in claim 11, further comprising a downstream inverter implementing one of XNOR, NAND, and OR logic functions.

* * * * *